US011005422B1

(12) United States Patent
Partridge et al.

(10) Patent No.: US 11,005,422 B1
(45) Date of Patent: May 11, 2021

(54) LOW ALLAN-DEVIATION OSCILLATOR

(71) Applicant: SiTime Corporation, Santa Clara, CA (US)

(72) Inventors: Aaron Partridge, Cupertino, CA (US); Sassan Tabatabaei, Sunnyvale, CA (US); Lijun Chen, San Jose, CA (US); Kamran Souri, The Hague (NL)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 16/807,952

(22) Filed: Mar. 3, 2020

Related U.S. Application Data

(62) Division of application No. 16/046,992, filed on Jul. 26, 2018, now Pat. No. 10,622,945.

(60) Provisional application No. 62/537,453, filed on Jul. 26, 2017.

(51) Int. Cl.
H03B 5/36 (2006.01)
H03F 3/04 (2006.01)
H03F 3/70 (2006.01)
G01C 19/56 (2012.01)
G01C 19/5726 (2012.01)

(52) U.S. Cl.
CPC .............. H03B 5/36 (2013.01); G01C 19/56 (2013.01); G01C 19/5726 (2013.01); H03F 3/04 (2013.01); H03F 3/70 (2013.01); H03B 2200/005 (2013.01); H03F 2200/129 (2013.01)

(58) Field of Classification Search
CPC ............... G01C 19/56; G01C 19/5726; G01C 19/5762; H03B 5/36; H03B 2200/005; H03B 2200/129; H03B 3/04; H03F 3/70
USPC ........ 331/154, 116 M, 117 FE, 116 FE, 158; 73/580, 504.16, 504.15, 504.14, 504.4, 73/504.12; 327/538, 513
See application file for complete search history.

(56) References Cited

U.S. PATENT DOCUMENTS

| 5,659,269 | A | 8/1997 | Meyers |
| 8,375,789 | B2 * | 2/2013 | Prandi ............... G01C 19/5762 73/504.12 |
| 8,922,288 | B2 | 12/2014 | Brekelmans |
| 2006/0033588 | A1 | 2/2006 | Caminada |

OTHER PUBLICATIONS

Prandi et al., "A Low-Power 3-Axis Digital-Output MEMS Gyroscope with Single Drive and Multiplexed Angular Rate Readout," ISSCC 2011 / Session 6 / Sensors& Energy Harvesting / 6.1, IEEE International Solid-State Circuits Conference, ISSCC 2011, Digest of Technical Papers, San Francisco, CA, USA, Feb. 20-24, 2011, 3 pages.

* cited by examiner

Primary Examiner — Arnold M Kinkead

(57) ABSTRACT

An oscillator includes a resonator, sustaining circuit and detector circuit. The sustaining circuit receives a sense signal indicative of mechanically resonant motion of the resonator generates an amplified output signal in response. The detector circuit asserts, at a predetermined phase of the amplified output signal, one or more control signals that enable an offset-reducing operation with respect to the sustaining amplifier circuit.

22 Claims, 2 Drawing Sheets

Phase-complementary synchronous auto-zeroing sustaining amplifier (with or without cap-ratioed gain)

Synchronous auto-zeroing sustaining amplifier with cap-ratioed gain

Synchronous auto-zeroing sustaining amplifier

LOW ALLAN-DEVIATION OSCILLATOR

CROSS REFERENCE TO RELATED APPLICATIONS

This application is a division of U.S. Utility patent application Ser. No. 16/046,992, filed Jul. 26, 2018, which in turn claims priority to U.S. provisional application No. 62/537,453 filed Jul. 26, 2017; each of the aforementioned patent applications is hereby incorporated by reference.

TECHNICAL FIELD

The disclosure herein relates to timing signal generation.

DRAWINGS

The various embodiments disclosed herein are illustrated by way of example, and not by way of limitation, in the figures of the accompanying drawings and in which like reference numerals refer to similar elements and in which.

DETAILED DESCRIPTION

Resonator-based oscillators having reduced 1/f noise corners are disclosed in various embodiments herein. In a number of implementations, the 1/f noise corner frequency ($f_C$) is lowered by active mitigation or canceling of a time-varying offset within a sustaining amplifier an offset cancelation/reduction that lowers the 1/f noise corner from ~5 KHz to less than 10 Hz in some embodiments, and to less than 1 or 2 Hertz in other embodiments, in either case reducing near phase noise (phase noise at low frequency) of the resonator-based oscillator by 20 to 30 dB or more relative to conventional resonator-based oscillators.

Figure 1:
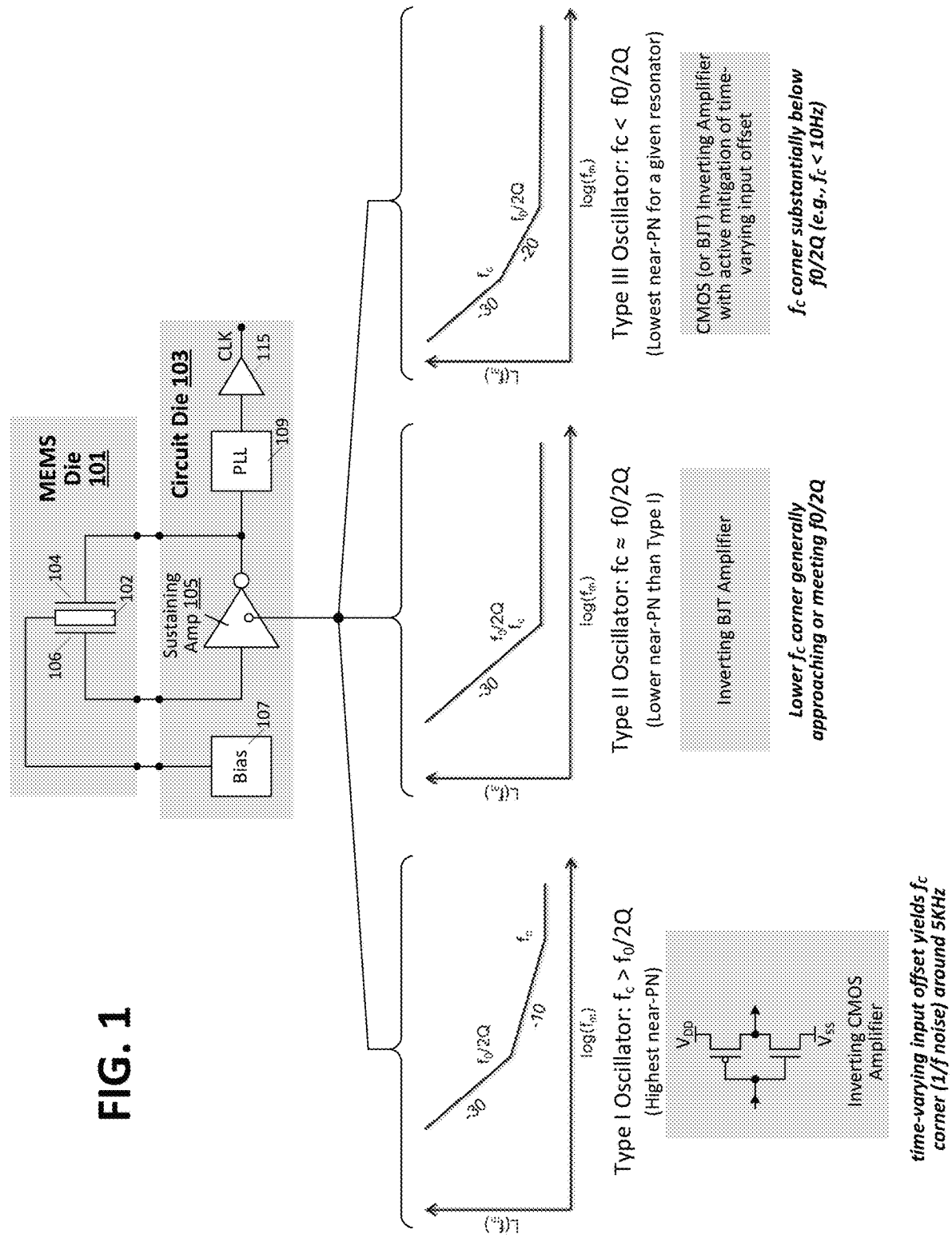
FIG. 1 illustrates a resonator-based oscillator in which 1/f corner reduction circuitry may be deployed.

FIG. 1 illustrates a resonator-based oscillator in which 1/f corner reduction circuitry may be deployed. In the exemplary two-die implementation shown, a microelectromechanical system (MEMS) resonator 102 is implemented in a first "MEMS" die 101 and circuitry for driving the MEMS resonator into mechanically resonant motion (i.e., "actuating" the resonator), sensing the resonator motion and producing a timing signal/clock signal (CLK) based on the sensed motion is disposed in a separate "circuit" die 103. The MEMS die and circuit die may be packaged together in various multi-die package configurations (e.g., side-by-side or stacked packages), including configurations in which the circuit die defines part of a resonator-encapsulating chamber. Also, other types of resonators may be used (quarts, inductor, thermal or resistor-based resonators) may be used The MEMS die depicted in FIG. 1 includes a voltage-biased electrostatic resonator. A sustaining amplifier 105 within circuit die 103 drives a time-varying signal at one or more "drive" electrodes 106 disposed in proximity to the resonator (mechanically resonant structure) receives an input signal via one or more "sense" electrodes 108 also disposed in proximity to the resonator. In a number of embodiments, the drive and sense electrodes are disposed adjacent opposite resonator amplitudes (i.e., maximum positive and negative displacements from neutral or resting position). The sense and drive electrodes are configured so that they can transduce motion to sense current or voltage (the sense side), and transduce voltage or current to force (the drive side). Various MEMS resonators can be used. In the exemplary embodiment, an electrostatic resonator is shown. The invention also works with other resonators, e.g. piezoelectric, or thermal. Or indeed for non-M EMS resonators such as quartz crystals, or electrical resonators such as inductor-capacitor tanks (LC) tanks.

An output also delivered, as the amplified resonator signal, to an optional clock multiplying circuit (an integer-N or fractional-N PLL 109 in this instance) to produce a frequency-multiplied output clock (i.e., resonator output multiplied by N). Optional output driver 115 delivers the output clock to other circuitry disposed within the circuit die and/or one or more other integrated circuit dies. Biasing circuit 107 establishes a known bias voltage on the resonant MEMS structure thus enabling a controlled electrostatic potential between the M EMS die and drive signal. For example, if the drive signal swings between ground and VDD supply rail potentials, the MEMS resonator may be biased at VDD/2 to yield balanced electrostatic attraction and repulsion (i.e., between the resonator and the drive electrode, the latter being implemented within a non-moving field area of the MEMS die) during opposite phases of the drive cycle.

FIG. 1 also illustrates three classes of oscillators distinguished by spectral relation between Leeson integration corner (201 output frequency divided by twice the quality factor, $f_0/2Q$) and 1/f noise corner ($f_C$) with class distinctions effected primarily through changes in sustaining amplifier implementation. In the type I oscillator, a CMOS (complementary metal oxide semiconductor) inverter forms the core of the sustaining amplifier. The inverter exhibits a time-varying input offset that yields a 1/f noise corner at approximately 5 KHz (1 KHz to 10 KHz typical) well beyond the ~100 Hz Leeson integration frequency. In the type II oscillator, an inverting amplifier implemented with bipolar junction transistors (BJTs) exhibits a 1/f corner generally approaching or meeting the Leeson integration corner (~100 Hz) and substantially lower near phase-noise than the type I implementation. To achieve type III operation (1/f corner is substantially below the Leeson integration frequency), circuitry is provided in conjunction with a CMOS or BJT amplifier to actively mitigate (reduce, cancel or eliminate) the time-varying input offset—an approach that yields a 1/f corner below 10 Hz (or even below 2 Hz or 1 Hz) and the lowest near phase-noise for a given resonator.

Figure 2:
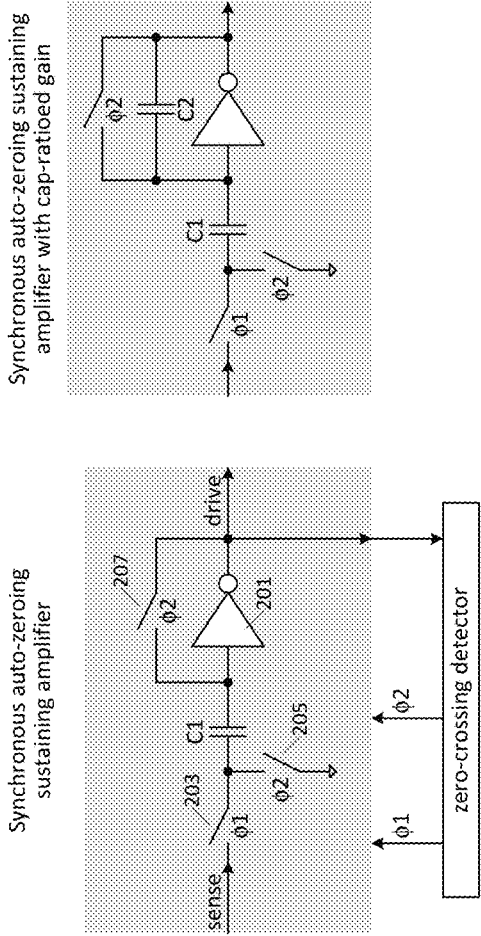
FIG. 2 illustrates an embodiment of an auto-zeroing sustaining amplifier that may be deployed as the sustaining amplifier in FIG. 1 to yield low Allan-Deviation performance.

FIG. 2 illustrates an embodiment of an auto-zeroing sustaining amplifier that may be deployed as the sustaining amplifier in FIG. 1 to yield type III oscillator performance (i.e., exceedingly low near phase-noise and thus low Allan Deviation). In the depicted implementation, a zero-crossing detection circuit detects passage of the resonator through the neutral point (rest point midway between the extreme positions in the resonator swing), asserting controls signal φ1 and φ2 at predetermined instants relative to the rising-edge and falling-edge zero-crossings and thus synchronously with respect to resonator oscillation. In one embodiment, the zero-crossing detector is implemented by a chain of inverters coupled to receive the sinusoidal resonator output (e.g., at the output of inverting amplifier 201 which may be implemented as shown in FIG. 1), with each inverter in the chain yielding a steeper (more square-wave like) output slew than its predecessor and the final inverter producing a square wave with a rising edge that transpires shortly after the ascending zero-crossing of the resonator signal and a falling edge shortly after the descending zero-crossing. Additional resonators may be provided within the chain to implement a multi-tap delay line (e.g., in an open loop or closed loop, the latter being a delay-locked loop), with selected inverter outputs providing complementary φ1 and φ2 signals. In the embodiment of FIG. 2, for example, the zero-crossing detector asserts φ1 for an interval that spans both the rising-edge and falling-edge zero crossings (deasserting φ2 during that interval) and then asserts φ2 (and deasserts φ1) for an interval that commences following the falling-edge zero crossing and concludes prior to the rising-edge zero crossing, thus ensuring that the amplifier delivers a valid drive-signal output to both the resonator and the zero-crossing detector during the positive phase of the resonator signal (while the resonator is nearer the drive electrode than the sense electrode) and both zero crossings. To avoid glitch, a brief time delay may be instituted between deassertion of φ1 and assertion of φ2 (and/or vice-versa) so that the two control signals are not perfect complements.

Figure 3:
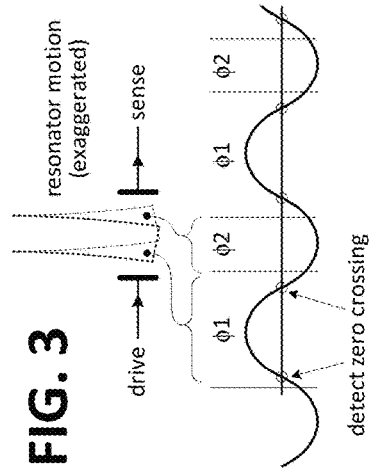
FIG. 3 illustrates the ϕ1, ϕ2 signal assertion overlaid with the resonator output, demonstrating the synchronous nature of the auto-zeroing operation in the FIG. 2 embodiment.

Still referring to FIG. 2, the φ1 and φ2 signals effect sequential signal-amplification and offset-zeroing operations with respect to inverting amplifier 201 during each resonator cycle. More specifically, throughout the positive half-period of the resonator cycle (i.e., while the resonator is nearer the drive electrode than the sense electrode), φ1 is asserted to close switch 203 (e.g., implemented by one or more CMOS transistors) while φ2 is deasserted to open switches 205 and 207. During a portion of the negative half-period of the resonator cycle (i.e., following the descending zero-crossing and prior to the subsequent ascending zero-crossing, while the resonator is nearer the sense electrode than the drive electrode), φ1 is deasserted to decouple the amplifier from the sense electrode (opening switch 203), while φ2 is asserted to close switches 205 and 207. In this configuration, the input node of capacitor C1 is quieted (e.g., grounded) while the amplifier output is fed back to the amplifier input to zero any DC offset—a zeroing that, if carried out frequently enough, substantially reduces or even eliminates the time-varying amplifier offset that is otherwise the predominant 1/f noise contributor (i.e., lowering $f_C$ to less than 10 Hz or even less than 1 Hz and thus effecting type III oscillator operation). FIG. 3 illustrates the φ1, φ2 signal assertion overlaid with the resonator output, demonstrating the synchronous nature of the auto-zeroing operation in the FIG. 2 embodiment. That is, auto-zeroing is synchronized with resonator oscillation to ensure amplifier operation during zero crossings and the predominant drive interval (while the resonator has moved to the drive-electrode side of the neutral position) and to auto-zero the amplifier (zeroing or neutralizing the DC offset) during a portion of the resonator cycle outside the predominant drive interval and between zero crossings.

Figure 4:
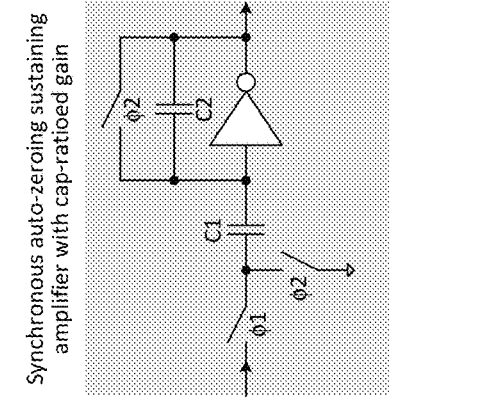
FIG. 4 illustrates an alternative implementation of a synchronous auto-zeroing sustaining amplifier, in this case having a capacitor C2 placed in the feedback path between amplifier output and input.

FIG. 4 illustrates an alternative implementation of a synchronous auto-zeroing sustaining amplifier, in this case having a capacitor C2 placed in the feedback path between amplifier output and input. In this integrating amplifier approach (capacitor C2 is charged and discharged by the inverter output during successive half-cycles of the resonator), the capacitance ratio between input capacitor C1 and integrating capacitor C2 (i.e., C2/C1) sets the amplifier gain. In addition to permitting potentially higher or precisely controlled gain than the embodiment of FIG. 2, the feedback capacitor may be implemented by a variable capacitance to provide for one-time or run-time programmable gain setting (e.g., by implementing the feedback capacitor with a switchably coupled branches of capacitance). Though not specifically shown, a zero-crossing detector may be coupled to/included as part of the auto-zeroing amplifier of FIG. 4 in the manner shown in FIG. 2, operating to produce control signals φ1 and φ2 generally as shown in FIG. 3.

The synchronous auto-zeroing amplifiers of FIGS. 2 and 4 are characterized by temporary disruption (disabling) of the amplifier output during the autozeroing interval. While this interval is shown to occur once per resonator cycle in FIG. 3, less-frequent auto-zeroing operations may be carried out—generally with any regularity sufficient to track and substantially zero the time-varying offset between input and output of the amplifier component. Moreover, to avoid or limit spurs in the spectral output of the oscillator, randomizing (or pseudo-randomizing) circuitry such as a pseudo-random bit sequence (PRBS) generator or delta-sigma modulator may be provided to trigger auto-zeroing operation once per desired interval but at a random time within that interval (or at random intervals).

Figure 5:
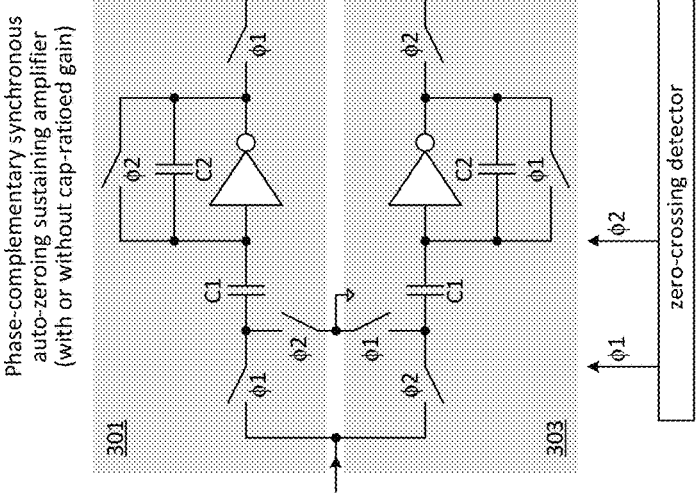
FIG. 5 illustrates an alternative approach in which parallel inverting amplifiers are operated in pipelined fashion to provide a seamless or relatively seamless output.
Figure 6:
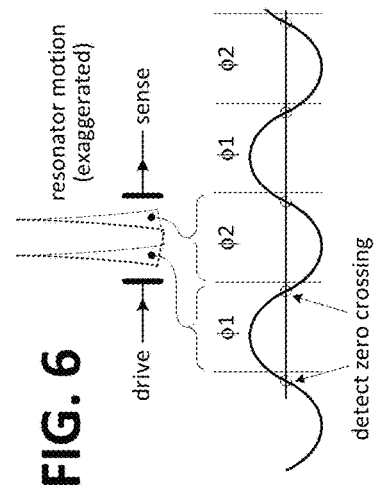
FIG. 6 illustrates an exemplary zero-crossing waveform showing the balanced switching of the ϕ1 and ϕ2 control signals.

FIG. 5 illustrates an alternative approach in which parallel inverting amplifiers are operated in pipelined (or parallel) fashion to provide a seamless or relatively seamless output (i.e., no temporary disruption during auto-zeroing). More specifically, two synchronous auto-zeroing amplifiers (or amplifier "stripes" 301 and 303) are coupled in parallel between input and output nodes and operated in complementary fashion—one auto-zeroing amplifier alternating between amplifier-output and auto-zeroing operation while the other auto-zeroing amplifier alternates between those operations in time-staggered order, auto-zeroing while the first amplifier generates an output and generating an amplified output while the first amplifier auto-zeroes. FIG. 6 illustrates an exemplary zero-crossing waveform showing the balanced switching of the φ1 and φ2 control signals. As can be seen the two signals are applied alternately within the two auto-zeroing amplifiers with φ1 asserted to configure amplifier stripe 301 for amplifier output and to configure stripe 303 for auto-zeroing, and φ2 asserted to produce the reverse configuration (stripe 301 auto-zero, stripe 303 amplifier output).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, signal path widths, signaling or operating frequencies, component circuits or devices and the like can be different from those described above in alternative embodiments. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

It should be understood that the amplifiers described here are exemplary, and various detailed auto-zero amplifier embodiments are known in the art. Various oscillator topologies are also known in the art. One core invention described herein is to apply an auto-zero amplifier, whether of a presently known or unknown design, switched in a synchronous manner, to decrease the 1/f corner of the amplifier and thereby decrease the phase noise of the oscillator to a lower value than it would be without a switched amplifier.

What is claimed is:
1. A device comprising:
a microelectromechanical systems (MEMS) structure having a body that is to move, during a first phase, in a first direction away from a first position and, during a second phase, in a second direction away from the first position;
circuitry to produce an output signal that changes as a function of motion of the body relative to a sensor;
circuitry to detect change in the motion of the body between the first direction and the second direction;
wherein the circuitry to sense the motion and to produce the output signal comprises active compensation circuitry that is switched in dependence on the change in motion;
wherein the device comprises a first die and a second die which are bonded together and electrically-coupled;
wherein the MEMS structure is carried by the first die; and
wherein the circuitry to produce the output signal, the circuitry to detect change and the active compensation circuitry are carried by the second die.

2. The device of claim 1, wherein:
the circuitry to produce comprises an amplifier circuit to receive a sense signal indicative of the motion of the body and to generate an amplified output signal in response to the sense signal; and
the active compensation circuitry is to perform offset cancelation to the amplifier circuit, the active compensation circuitry being switched in dependence on the change in motion.

3. A device comprising:
a microelectromechanical systems (MEMS) structure having a body that is to move, during a first phase, in a first direction away from a first position and during a second phase, in a second direction away from the first position;
circuitry to produce an output signal that changes as a function of motion of the body relative to a sensor;
circuitry to detect change in the motion of the body between the first direction and the second direction;
wherein the circuitry to sense the motion and to produce the output signal comprises active compensation circuitry that is switched in dependence on the change in motion;
wherein the circuitry to produce comprises an amplifier circuit to receive a sense signal indicative of the motion of the body and to generate an amplified output signal in response to the sense signal;
wherein the active compensation circuitry is to perform offset cancelation to the amplifier circuit, the active compensation circuitry being switched in dependence on the change in motion; and
wherein the active compensation circuitry comprises a detector circuit to assert, at a predetermined phase of the amplified signal, one or more control signals that enable an offset-reducing operation to reduce noise in the amplifier circuit.

4. The device of claim 3, wherein the MEMS structure is a resonator that is to resonate at a frequency (f) and wherein the offset-reducing operation reduces (1/f) noise in the amplifier circuit.

5. The device of claim 4, wherein:
the device comprises a first die and a second die which are bonded together and electrically-coupled;
the MEMS structure is carried by the first die; and
the circuitry to produce the output signal, the circuitry to detect change and the active compensation circuitry are carried by the second die.

6. The device of claim 5, wherein the MEMS structure is a resonator.

7. A device comprising:
a microelectromechanical systems (MEMS) structure having a body that is to move, during a first phase, in a first direction away from a first position and, during a second phase, in a second direction away from the first position;

circuitry to produce an output signal that changes as a function of motion of the body relative to a sensor;
circuitry to detect change in the motion of the body between the first direction and the second direction;
wherein the circuitry to sense the motion and to produce the output signal comprises active compensation circuitry that is switched in dependence on the change in motion;
wherein the circuitry to produce comprises an amplifier circuit to receive a sense signal indicative of the motion of the body and to generate an amplified output signal in response to the sense signal;
wherein the active compensation circuitry is to perform offset cancelation to the amplifier circuit, the active compensation circuitry being switched in dependence the change in motion;
wherein the amplifier circuit comprises an input node coupled to receive the sense signal, an inverting amplifier having an input and an output and a variable capacitance element coupled between the input node and the input of the inverting amplifier; and
wherein the variable capacitance element is to be programmed at least once following manufacture of said device.

8. A device comprising:
a microelectromechanical systems (MEMS) structure having a body that is to move, during a first phase, in a first direction away from a first position and, during a second phase, in a second direction away from the first position;
circuitry to produce an output signal that changes as a function of motion of the body relative to a sensor;
circuitry to detect change in the motion of the body between the first direction and the second direction;
wherein the circuitry to sense the motion and to produce the output signal comprises active compensation circuitry that is switched in dependence on the change in motion;
wherein the circuitry to produce comprises a first amplifier circuit to receive a sense signal indicative of the motion of the body and to generate an amplified output signal in response to the sense signal;
wherein the active compensation circuitry is to perform offset cancelation to the first amplifier circuit, the active compensation circuitry being, switched in dependence on the change in motion;
wherein the circuitry to produce comprises a second amplifier circuit to receive a sense signal indicative of the motion of the body and to generate an amplified output signal in response to the sense signal; and
wherein the first amplifier circuit and the second amplifier circuit are complementary, and are to sense complement motion of the body during a respective one of first and second phases.

9. The device of claim 1, wherein the circuitry to detect the change in motion comprises a zero-crossing detector.

10. A device comprising:
a microelectromechanical systems (MEMS) structure having a body that is to move, during a first phase, in a first direction away from a first position and, during a second phase, in a second direction away from the first position;
circuity to produce an output signal that chances as a function of motion of the body relative to a sensor;
circuitry to detect change in the motion of the body between the first direction and the second direction;
wherein the circuit sense the motion and to produce the output signal comprises active compensation circuitry that is switched in dependence on the chance in motion;
wherein the circuitry detect the change in motion comprises a zero-crossing detector; and
wherein the zero-crossing detector is to assert one or more control signals in response to detection of a first zero-crossing in a signal representing sensed motion of the body and is to deassert the one or more control signals in response to detection of a second zero-crossing in the signal representing sensed motion of the body.

11. A device comprising:
a package mounting a first die and a second die;
a microelectromechanical (MEMS) structure carried by the first die, wherein the MEMS structure has a body that is to move, during a first phase, in a first direction away from a first position and, during a second phase, in a second direction away from the first position, and a sensor that is to produce a sense signal that changes as a function of motion of the body relative to the sensor; and
processing circuitry carried by the second die, wherein the second die is to receive the sense signal from the first die, and wherein the processing circuitry includes circuitry to circuitry to detect change in the motion of the body between the first direction and the second direction, active compensation circuitry that is switched in dependence on the change in motion, and circuitry to produce an output signal in dependence on the sense signal and compensation provided by the active compensation circuitry.

12. The device of claim 11, wherein the MEMS structure is a resonator and the output signal comprises a timing signal.

13. The device of claim 11, wherein:
the circuitry to produce comprises an amplifier circuit to receive a sense signal indicative of the motion of the body and to generate an amplified output signal in response to the sense signal; and
the active compensation circuitry is to perform offset cancelation for the amplifier circuit, the active compensation circuitry being switched in dependence on the change in motion.

14. The device of claim 13, wherein the active compensation circuitry comprises a detector circuit to assert, at a predetermined phase of the amplified signal, one or more control signals that enable an offset-reducing operation to reduce noise in the amplifier circuit.

15. The device of claim 13, wherein the MEMS structure is a resonator that is to resonate at a frequency (f) and wherein the offset-reducing operation reduces (1/f) noise in the amplifier circuit.

16. The device of claim 13, wherein the amplifier circuit comprises an input node coupled to receive the sense signal, an inverting amplifier having an input and an output and a variable capacitance element coupled between the input node and the input of the inverting amplifier, wherein the variable capacitance element is to be programmed at least once following manufacture of said device.

17. The device of claim 13, wherein:
the amplifier circuit is a first amplifier circuit;
the circuitry to produce comprises a second amplifier circuit to receive a sense signal indicative of the motion of the body and to generate an amplified output signal in response to the sense signal; and the first amplifier circuit and the second amplifier circuit are complementary, and are to sense complement motion of the body during a respective one of first and second phases.

18. The device of claim 11, wherein the circuitry to detect the change in motion comprises a zero-crossing detector.

19. The device of claim 18, wherein the zero-crossing detector is to assert one or more control signals in response to detection of a first zero-crossing in a signal representing sensed motion of the body and is to deassert the one or more control signals in response to detection of a second zero-crossing in the signal representing sensed motion of the body.

20. A device comprising:
a microelectromechanical (MEMS) resonator carried by a die, wherein the MEMS resonator has a body that is to move, during a first phase, in a first direction away from a first position and during a second phase, in a second direction, away from the first position, and a sensor that is to produce a sense signal that changes as a function of motion of the body relative to the sensor; and
processing circuitry to receive the sense signal and produce an output timing signal dependent on mechanically-resonant motion of the body, wherein the processing circuitry includes an amplifier circuit, circuitry to circuitry to detect change in the motion of the body between the first direction and the second direction, active compensation circuitry to provide offset compensation for the amplifier circuit, the active compensation circuitry being switched according to the change in motion;
wherein the amplifier circuit is a first amplifier circuit;
wherein the circuitry to produce comprises a second amplifier circuit to receive a sense signal indicative of the motion of the body and to generate an amplified output signal in response to the sense signal; and
wherein the first amplifier circuit and the second amplifier circuit are complementary, and are to sense complement motion of the body during a respective one of first and second phases.

21. The device of claim 20, wherein the MEMS resonator is to resonate at a frequency (f) and wherein the offset-reducing operation is to reduce (1/f) noise in the amplifier circuit.

22. The device of claim 2, wherein:
the amplifier circuit is a first amplifier circuit;
the circuitry to produce comprises a second amplifier circuit to receive a sense signal indicative of the motion of the body and to generate an amplified output signal in response to the sense signal; and
the first amplifier circuit and the second amplifier circuit are complementary, and are to sense complement motion of the body during a respective one of first and second phases.

* * * * *